(12) United States Patent
Huang (10) Patent No.: US 6,258,667 B1
(45) Date of Patent: Jul. 10, 2001

(54) METHOD FOR IMPLEMENTING EMBEDDED FLASH

(75) Inventor: Chih-Jen Huang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/386,672

(22) Filed: Aug. 31, 1999

(51) Int. Cl.[7] ............................................. H01L 21/8247
(52) U.S. Cl. ........................ 438/258; 438/592; 438/952
(58) Field of Search ................................ 438/257–267, 438/552, 952

(56) References Cited

U.S. PATENT DOCUMENTS

| | | | |
|---|---|---|---|
| 5,863,820 | * | 1/1999 | Huang .................................... 438/241 |
| 5,888,869 | * | 3/1999 | Cho et al. .............................. 438/258 |
| 6,015,730 | * | 1/2000 | Wang et al. ........................... 438/241 |
| 6,037,222 | * | 3/2000 | Huang et al. .......................... 438/257 |
| 6,069,033 | * | 5/2000 | Verhaar et al. ........................ 438/201 |
| 6,074,915 | * | 6/2000 | Chen et al. ............................ 438/258 |
| 6,096,595 | * | 8/2000 | Huang .................................... 438/238 |
| 6,096,603 | * | 8/2000 | Chang et al. .......................... 438/258 |

* cited by examiner

*Primary Examiner*—Richard Booth (57) ABSTRACT

A method for implementing embedded flash is disclosed. The embedded flash, which comprises memory cells and logic peripherals, is formed on a substrate where a gate oxide layer, a tunneling oxide layer and a floating gate are performed. The spirit of the invention is that transistors of the cell region and transistors of the peripheral region are implemented separated. In the proposed method, after transistors of the peripheral region are totally formed, then formation of transistors of the cell region begins to perform. Therefore, not only material of spacers of transistors of peripheral region, but also silicides can only be formed on the peripheral region and on the gate transistors of the cell region. Beside, ARC layer are fabricated on the embedded flash before spacers of transistors of cell region are fabricated. Thus, for memory cells, issues of both junction breakdown voltage and junction leakage also is not degraded by silicides. In comparison, for logic peripherals, performances are enhanced by spacers of transistors are formed by nitride and proper silicides.

22 Claims, 6 Drawing Sheets

METHOD FOR IMPLEMENTING EMBEDDED FLASH

BACKGROUND OF THE INVENTION

1. Field of the Invention

This invention is in the field of integrated circuits, and is more specifically directed to the fabrication of embedded flash.

2. Description of the Prior Art

Non-volatile memory devices are important for they provide an advantage that random access memory (RAM), both dynamic and static, cannot provide. That is, non-volatile memory devices do not lose their memory even the power is turned off.

Read only memory (ROM) is the most popular variety of nonvolatile memory devices. ROMs come in a number of visions and a relatively advanced type of ROMs is the flash memory that uses a technology similar to the erasable programmable ROM.

However, the flash memory is electrically reprogrammable for a limited number of times. This makes it ideal for those applications where only a few changes in the programming of the system is for either the entire memory array or for blocks of it.

Beside, memory storage exists not only as stand-alone memory device, but also embedded in processor chips. The performance of an embedded flash can be better than other types of flash since bandwidth problems are reduced and interface circuit and package leads are eliminated. It can also have characteristic tailored to the specific application rather than being a standardized comprise between many factors such as high operating speed.

The most obvious limiting factor for an embedded flash is the cost. Another serious disadvantage of the embedded flash is relevant fabrication. Owing to the fact that in conventional fabrication both spacers and silicides of transistors of both cell (memory) region and (peripheral) logic region are formed simultaneously, conventional embedded flash has the following main disadvantages:

(1) Spacers of transistors of both peripheral region and cell region are formed by the same material. Therefore, quality of transistors of both peripheral region and cell region cannot be optimized at the same time. In other words, either performance of any transistor of a peripheral cell is degraded or reliability of any cell region is degraded.

(2) Sources/drains of transistors of cell regions are covered by silicides, therefore, junction breakdown voltage is decreased and junction leakage is increased and qualities of memory cells are degraded.

(3) The ultra-violet (UV) erasing process of the cell region is degraded by the borderless contact stop layer.

Therefore, it is indisputable that development of a new fabrication of the embedded flash to overcome these disadvantages of conventional fabrication is desired. And it is more important when the flash is an irreplaceable product of ultra large scale integration (ULSI).

SUMMARY OF THE INVENTION

It is an object of the invention to provide a method for implementing an embedded flash that not only efficiently avoids issues of UV erasure but also efficiently avoids issue of nitride spacer stress.

It is another object of the invention to provide such a method for implementing an embedded flash where junction breakdown voltage and junction leakage of any memory cell are not degraded by saliciation.

It is a further object of the invention to provide a manufacturable fabrication of embedded flash.

In order to positively explain the invention that relates to a method of implementing an embedded flash, the embedded flash is formed on a substrate that is divided into at least a cell region and a peripheral region. Formation of the presented embodiment comprises following steps:

First, a substrate is provided that is entirely covered by a polysilicon layer. Wherein, in the peripheral region, a gate oxide layer is formed below the polysilicon layer, in the cell region, a tunneling oxide layer is formed below the polysilicon layer. Moreover, a plurality of floating gates are formed on the tunneling oxide layer, where the top of each floating gate is covered by a first dielectric layer and a sidewall of each floating gate is covered by a first thermal oxide layer.

Second, entire cell region is covered by a first photo-resist then forms a plurality of first metal oxide semiconductor transistors on the peripheral region.

Third, the first photo-resist is removed and then a self-aligned silicide process is performed to form a plurality of silicides that cover the source, drain and gate of each first metal oxide semiconductor transistor. Moreover, these silicides also cover entire cell region.

Fourth, the entire substrate is covered by an anti-reflection layer and then the entire peripheral region is covered by a second photo-resist.

Fifth, a plurality of second metal oxide semiconductor transistors are formed on the cell region. Material of a plurality of spacers of these second metal oxide semiconductor transistors can be different from material of a plurality of spacers of first metal oxide semiconductor transistors. Beside, these silicides only cover the top of each second metal oxide semiconductor transistor and the anti-reflection layer also only covers top of each second metal oxide semiconductor transistor. Additionally, a plurality of second thermal oxide layers are formed on the sidewalls of these second metal oxide semiconductor transistors before these spacers are formed.

Finally, a second dielectric layer is formed on the substrate and then a plurality of contacts are formed in said second dielectric layer. The second dielectric layer totally covers all first metal oxide semiconductor transistors and all second metal oxide semiconductor transistors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

To properly elucidate the spirit and advantages of the proposed invention, the conventional fabrication of embedded flash is illustrated in the following paragraphs to provide a comparison.

Figure 1:
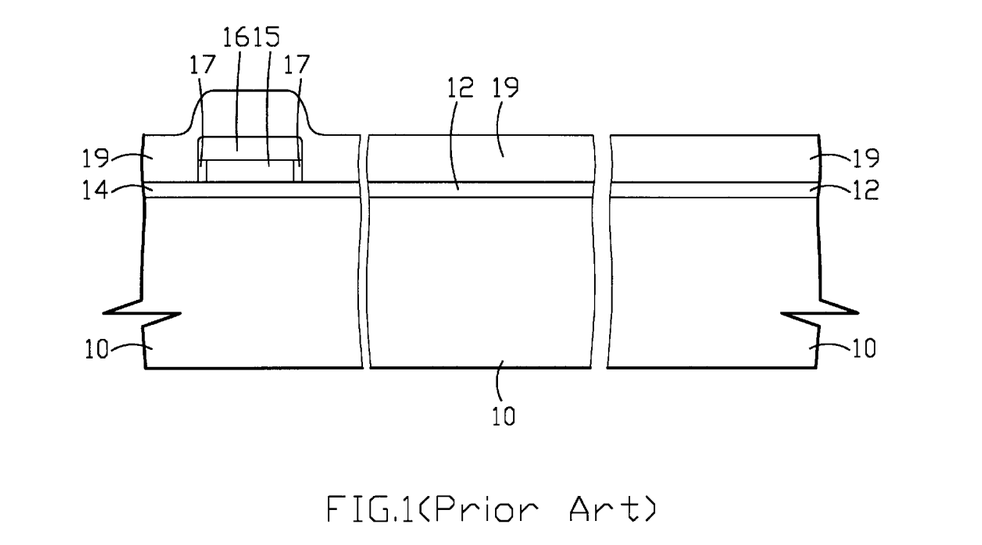
FIG. 1 to FIG. 5 are a series of cross-sectional views illustrating various steps of conventional fabrication of an embedded flash.

First, referring to FIG. 1, substrate 10 is divided into at least two regions: the cell region for memory function and the peripheral region for logic function. In general, owing to the fact that complementary metal oxide semiconductor transistors are broadly used by the embedded flash, the peripheral region comprises an N-type MOS region and a P-type MOS region. The peripheral region is covered by gate oxide layer 12 and cell region is covered by tunneling oxide layer 14. A plurality of floating gates 15 are formed on floating oxide layer 14 where each floating gate 15 is covered by ONO dielectric 16 and a sidewall of each floating gate 15 is covered by thermal oxide layer 17. Consequently, polysilicon layer 19 is formed on substrate 10 and thoroughly covers all structures on the surface of substrate 10.

Figure 2:
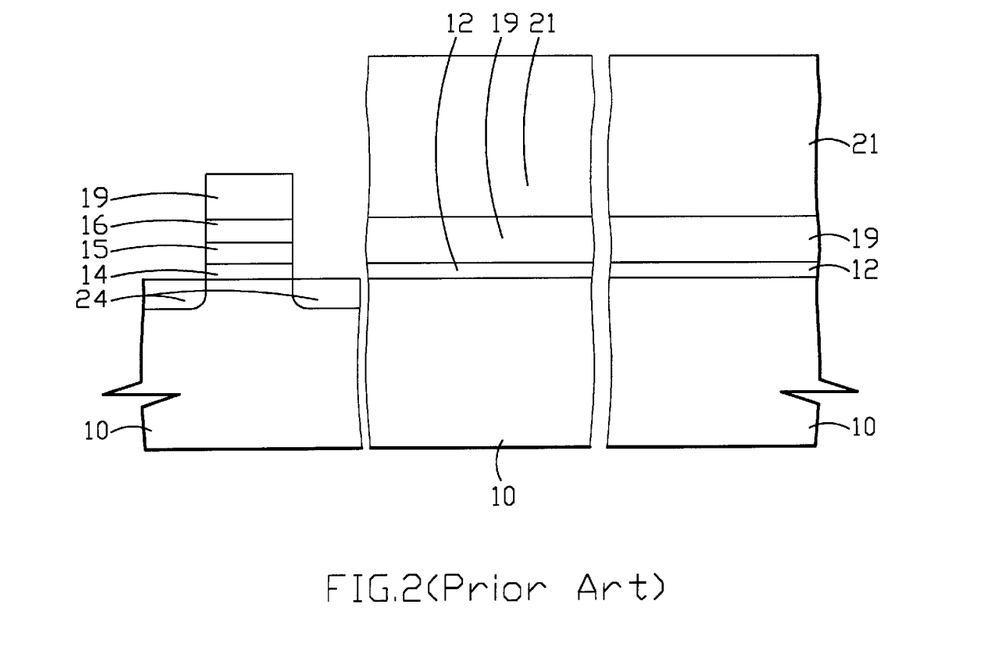

Second, referring to FIG. 2, a first photolithography process is performed to form numbers of gates on cell region, and then sources/drains 24 of the cell region are formed, where first photo-resist 21 covers the entire peripheral region.

Figure 3:
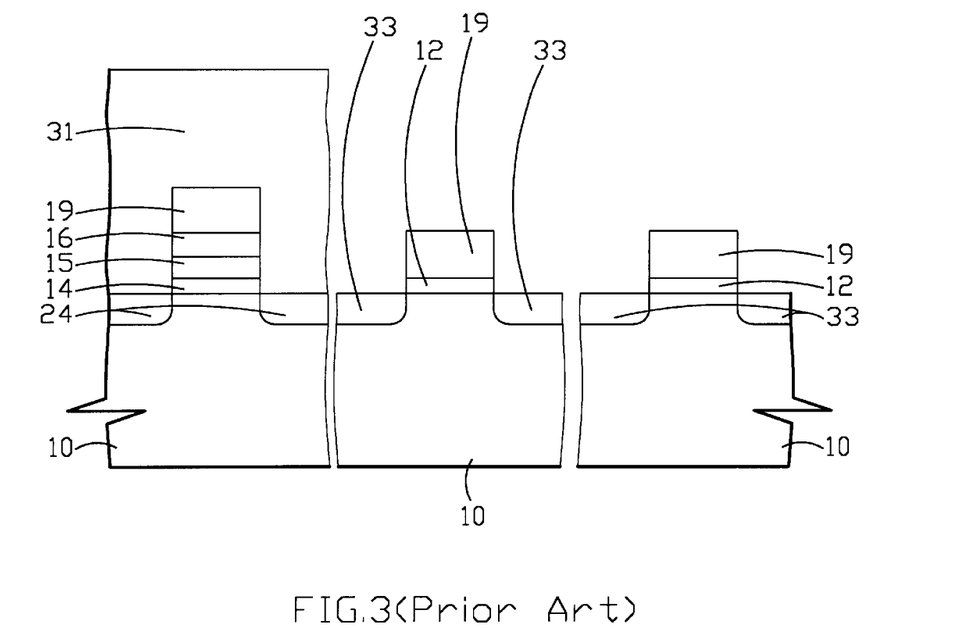

Third, referring to FIG. 3, a second photolithography process is performed to form numbers of gates on peripheral region, where the total cell region is covered by second photo-resist 31. Light doped drains 33 of the peripheral region also are formed. Of course, when transistors in the peripheral region are complementary metal oxide semiconductor transistors, gates and light doped drains 33 of both P-type MOS and N-type MOS are implemented separated.

Figure 4:
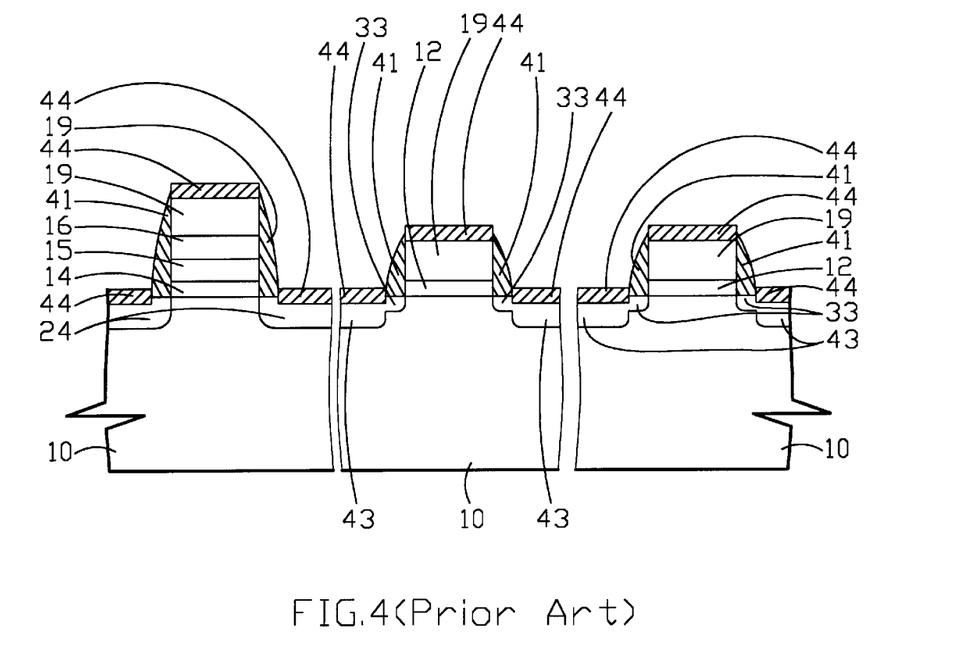

Fourth, referring to FIG. 4, second photo-resist 31 is removed and then spacers 41 of both cell region and peripheral region are formed simultaneously, where possible material of these spacers comprises oxide and nitride. And then sources/drains 43 of peripheral region are formed in sequence. Herein, when transistors in peripheral region are complementary metal oxide semiconductor transistors, sources/drains 43 of different type MOSs are implemented separated.

Consequently, saliciation process is used to implement a plurality of silicides 44. In addition, silicides 44 not only cover sources/drains 24 of cell region and sources/drains 43 of peripheral region, silicides 44 also cover numbers of gates of cell region and numbers of gates of the peripheral region.

Figure 5:
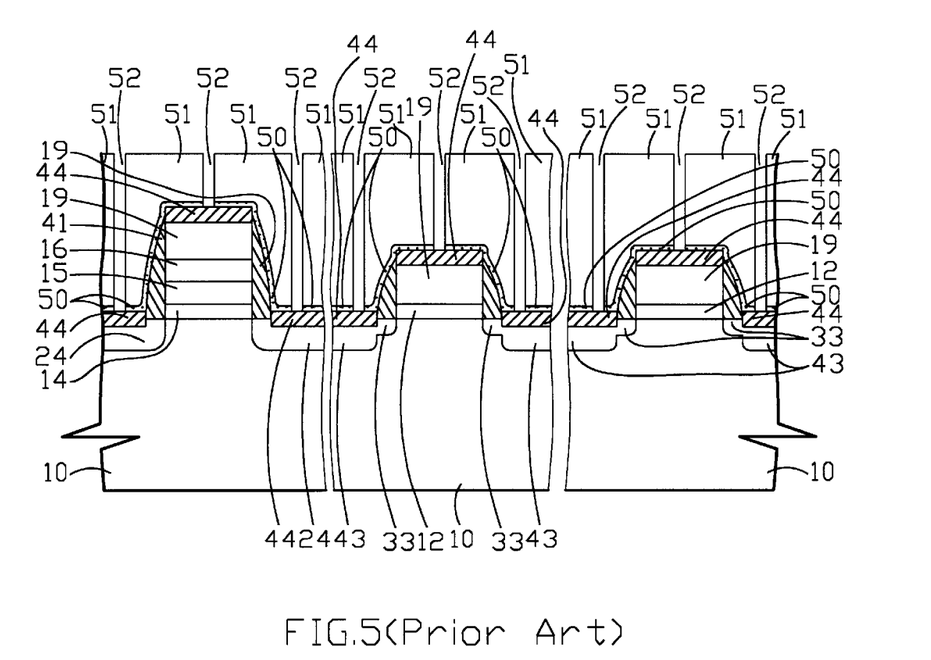

Fifth, referring to FIG. 5, anti-reflection layer 50 and first dielectric layer 51 are formed on substrate 10 in sequence and cover all structures on surface of substrate 10. And then a plurality of contacts 52 are formed inside second dielectric layer 51. Of course, to implement a complete integrated circuit, metallization process and formation of passivation should be performed.

Obviously, in the conventional fabrication of an embedded flash, only sources/drains/gates are separately formed in different region, spacers 41 and silicides 44 are formed simultaneously. Beside, anti-reflection layer 50 also covers both cell region and the peripheral region. Therefore, performance of transistors of the cell region and performance of transistors of the peripheral region cannot be optimized simultaneously.

In contrast, the invention provides a method that performance of transistors of the cell region and performance of transistors of peripheral region can be optimized simultaneously.

Figure 6:
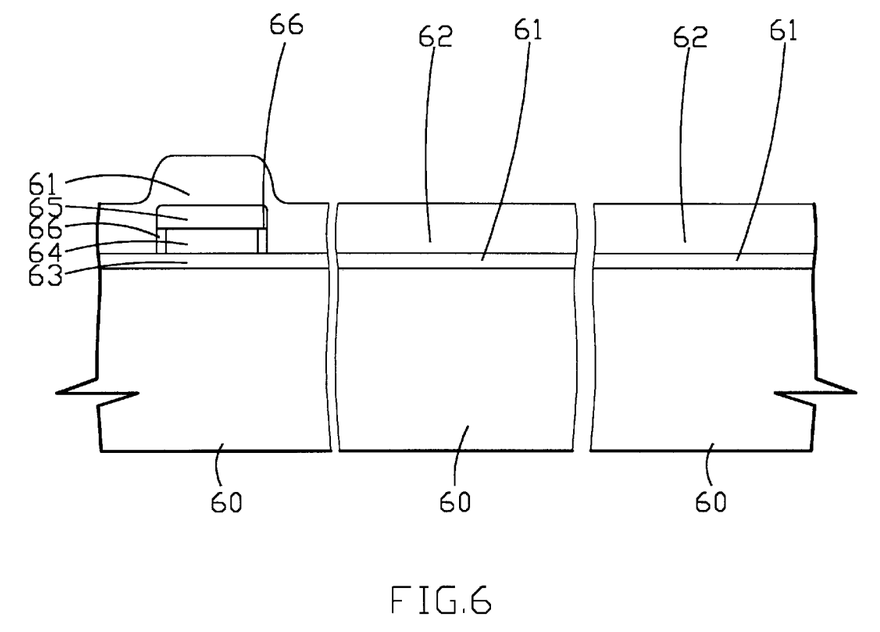
FIG. 6 to FIG. 11 are a series of cross-sectional views illustrating different steps of the proposed method that relates to fabrication of embedded flash.

The provided embodiment is a method of implementing an embedded flash, as shown in FIG. 6, where the embedded flash is formed in and on substrate 60 which is divided into at least a cell region for memory function and a peripheral region for logic function. Herein, substrate 60 further comprises a plurality of isolations and a plurality of wells, and substrate 60 is entirely covered by polysilicon layer 61. Beside, below polysilicon layer 61, gate oxide layer 62 covers the entire peripheral region, and tunneling oxide layer 63 covers the entire cell region where a plurality of floating gates 64 are formed on tunneling oxide layer 63.

Moreover, thickness of tunneling oxide layer 63 is broadly thicker than 80 angstroms, and a typical thickness of tunneling oxide layer 63 is about 100 angstroms. Further, the sidewall of each floating gate 64 is covered by first thermal oxide layer 66 and the top of each floating gate 64 is covered by first dielectric layer 65 such as ONO composite dielectric tri-layer. Herein, the ONO composite dielectric tri-layer is provided by three adjacent dielectric layers, where the middle layer is SiN layer and the others are oxide layers.

The proposed method further comprises forming an additional anti-reflection layer on polysilicon layer 61 before following fabrication processes such as formation of photoresist. Herein, additional anti-reflection layer is used to improve photo process margin and methods to form said additional anti-reflection layer comprises chemical vapor deposition.

Figure 7:
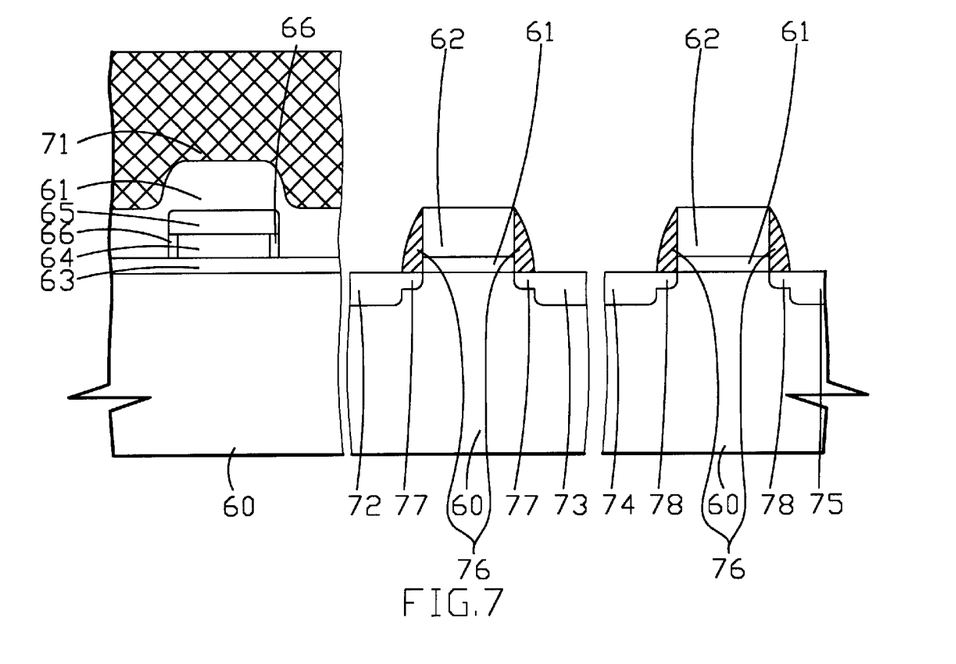

Consequently, as shown in FIG. 7, first photo-resist 71 is formed on and covers the entire cell region such that formation of transistors of peripheral region does not affect the cell region. A plurality of first metal oxide semiconductor transistors are formed on the peripheral region, where first metal oxide semiconductor transistors comprise sources 72/74, drains 73/75, light doped drains 77/78, spacers 76 and gates that formed by polysilicon layer 61 and gate oxide semiconductor transistors further comprise pockets. When transistors of peripheral region are totally formed, first photo-resist 71 is removed.

In addition, varieties of first metal oxide semiconductor transistors in the peripheral region comprise complementary metal oxide semiconductor transistor (CMOS). When they are CMOS, the peripheral region comprises a region for N-type MOS (NMOS) and a region for P-type MOS (PMOS). Of course, when transistors of the peripheral region are CMOS, source 72 are different from the sources 74, drains 73 are different from drains 75 and light doped 77 are different from light doped drains 78. However, spacers 76 are formed simultaneously and the material of spacers 76 comprises nitride. In general, spacers 76 are made of SiN for width of spacer 76 is efficiently decreased by SiN and then hot carrier reliability is enhanced for peripheral high response speed, though spacers also can be formed by tetraethyl-orthosilicate.

Figure 8:
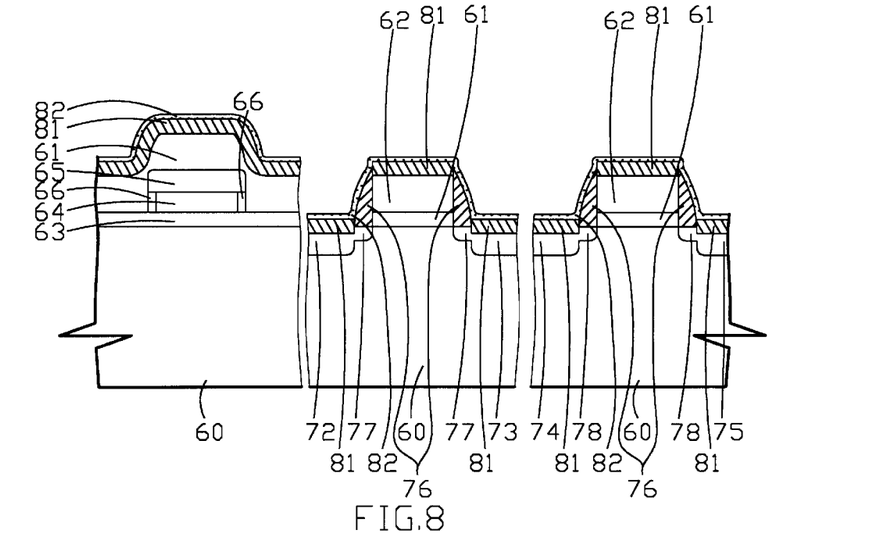

Therefore, as shown in FIG. 8, a self-aligned silicide process and a forming process of anti-reflection layer are fabricated in sequence. Thus, a plurality of silicides 81 are formed such that sources 72/74, drains 73/75 are covered by silicides 81, where possible materials of silicides 81 comprise $TiSi_2$ and $COSi_2$. Moreover, owing to the fact that polysilicon layer 61 covers the entire cell region and the gate of each first metal oxide semiconductor transistor, silicides 81 also cover entire cell region and gate of each first metal oxide semiconductor transistor. Anti-reflection layer 82 is formed on entire substrate 60, where possible materials of anti-reflection layer 82 comprise SiON, SIN and nitride.

Figure 9:
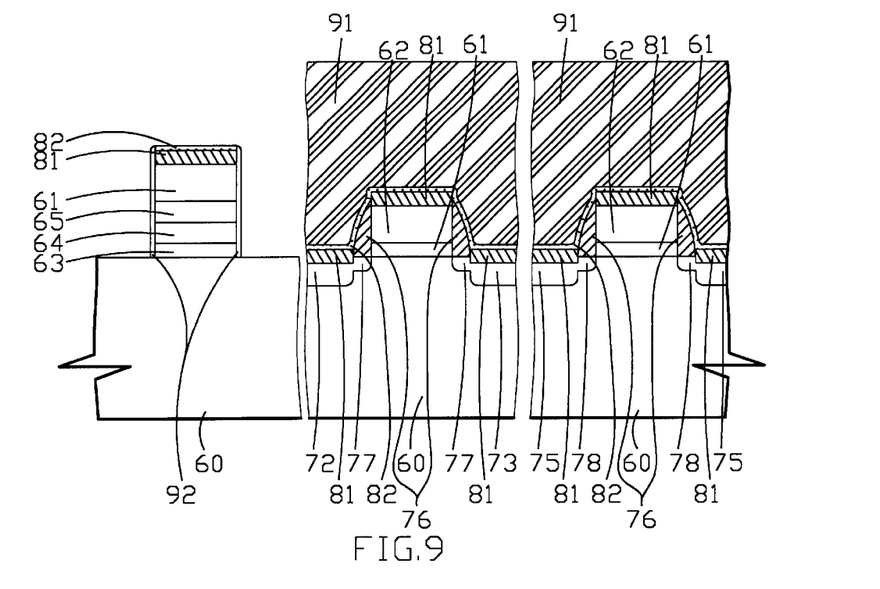

Thereupon, as shown in FIG. 9, second photo-resist 91 is formed to cover the entire peripheral region, and then a plurality of gates of second metal oxide semiconductor transistors are formed on the cell region by a photolithography process. In additional, a plurality of second thermal oxide layers 92 are formed on sidewall of each said second metal oxide semiconductor transistor to prevent charger loss and to repair etching damages of sidewalls. Herein, second thermal oxide layers 92 consist of a thin furnace thermal oxide and a oxide which is fabricated by chemical vapor deposition process with a typical temperature about 780° C. to 800° C.

Figure 10:
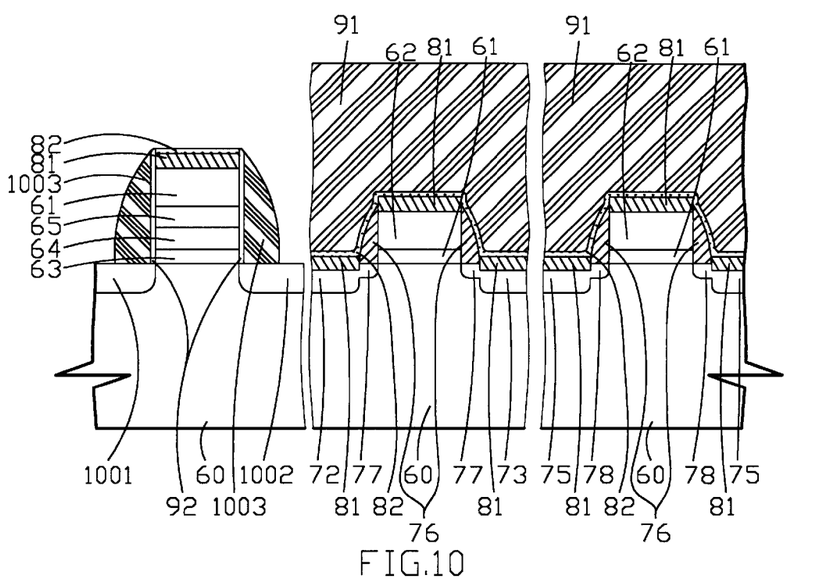

Consequently, as shown in FIG. 10, sources 1001, drains 1002 and spacers 1003 are formed around gates of second metal oxide semiconductor transistors, where each gate is formed by tunneling oxide layer 63, floating gate 64, first dielectric 65, polysilicon layer 61, silicide 81 and anti-reflection layer 82. Herein, material of spacer 1003 of second metal oxide semiconductor transistor can be different from spacers 76 of first metal oxide semiconductor transistors. In general, spacers 1003 are formed by oxide for ultra-violet (UV) light can penetrate oxide. Moreover, after the photolithography process, silicides 81 only cover the top of each second metal oxide semiconductor transistor. Anti-reflection layer 82 also only covers the top of each second metal oxide semiconductor transistor.

Figure 11:
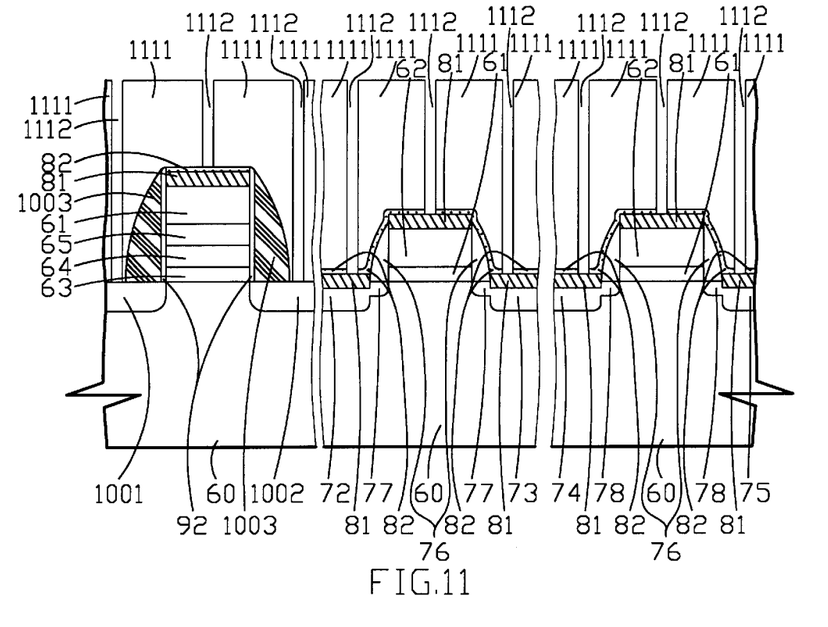

Finally, as shown in FIG. 11, second dielectric layer 1111 is formed on substrate 60, wherein second dielectric layer 1111 thoroughly covers all first metal oxide semiconductor transistors and all second metal oxide semiconductor transistors. Incidentally, material of second dielectric layer 1111 comprises oxide. Then, a plurality of contacts 1112 are formed in second dielectric layer 1111 and are connected to first metal oxide semiconductor transistors and second metal oxide semiconductor transistors. Of course, to implement a complete integrated circuit, metallization process and formation of passivation should be performed.

According to previous discussion of the provided embodiment, it is obvious that the proposed invention has at least the following obvious advantages:

First, spacers 76 in peripheral region can be formed by nitride and spacers 1003 in cell region can be formed by oxide simultaneously. Therefore, the width of any spacer 76 in the peripheral region can be decreased by application of nitride, and efficiency of the erasing process of each cell region by ultra-violent light is not degraded by nitride, for UV light can penetrate oxide. Moreover, oxide spacers 1003 in the cell region not only improve efficiency of the erasing process by ultra-violet light, but also avoid the high stress disadvantage of nitride.

Second, during formation of contacts 1112, since etching process can be adjusted to provide enough sensitive etching selectivity between anti-reflection layer 82 and second dielectric layer 1111, anti-reflection layer 82 will behave as an etching-stop layer. Then borderless contacts can be formed and the efficiency of the related etching process is enhanced. Regardless, since transistors of the cell region are fabricated when anti-reflection layer 82 is formed, anti-reflection layer 82 does not incur any UV erasure problems.

Third, owing to the fact that silicides 81 are not formed on any source 1001 or any drain 1002 of second metal oxide semiconductor transistors. Therefore, junction breakdown voltage of any memory cell is not degraded by silicides 81, and then leakage current of the embedded flash is efficiently decreased.

Obviously, because these obvious advantages of the invention can efficiently overcome the main disadvantages of conventional fabrication of embedded flash, though fabrication of the proposed invention is a bit more complicated than conventional fabrication, it is reasonable and beneficially to implement required embedded flash by the invention.

According to the previous discussions, it is clear that the key point of the invention is that transistors of the cell region and transistors of the peripheral region are implemented separated, where transistors of the cell region are formed when transistors of the peripheral region are totally formed. Thus, not only can material of the spacers of transistors of the cell region can be different to the material of spacers of transistors of the peripheral region, but also silicides can be only formed on the peripheral region and gates of transistors of the cell region. Additionally, an anti-reflection (ARC) layer also can be fabricated on the embedded flash before transistors of the cell region are fabricated. Therefore, in the cell region, issues of UV erasure and nitride spacer stress can be avoided, and an issue of junction breakdown voltage also is not degraded by silicide. On the other hand, in the peripheral region, performance is enhanced by proper silicides and spacers of transistors.

While the invention has been described by three embodiments, the invention is not limited there to. To the contrary, it is intended to cover various modifications and the scope of these claims therefore should be accorded to the broadest interpretation so as to encompass all such modifications and similar arrangement, procedures and products.

What is claimed is:

1. A method of implementing an embedded flash, said method comprising:

providing said substrate which is divided into at least a cell region and a peripheral region;

forming a gate oxide layer on said peripheral region and forming a tunneling oxide layer on said cell region;

forming a plurality of floating gates on said tunneling oxide layer, wherein the top of each of said floating gates is covered by a first dielectric layer and the sidewall of each of said floating gate is covered by a first thermal oxide layer;

covering said first dielectric layer, said first thermal oxide layer and said gate oxide layer by a polysilicon layer;

covering said entire cell region by a first photo-resist;

forming a plurality of first metal oxide semiconductor transistors on said peripheral region;

removing said first photo-resist;

performing a self-aligned silicide process to form a plurality of silicides, herein said silicides covers source, drain and gate of each said first metal oxide semiconductor transistor, said silicides also covering said entire cell region;

covering said entire substrate by an anti-reflection layer;

covering said entire peripheral region by a second photo-resist;

forming a plurality of second metal oxide semiconductor transistors on said cell region, wherein said silicides only cover the top of each of said second metal oxide semiconductor transistors, and said anti-reflection layer also only covers top of each said second metal oxide semiconductor transistors;

forming a second dielectric layer on said substrate, wherein said second dielectric layer totally covers all said first metal oxide semiconductor transistors and all said second metal oxide semiconductor transistors; and forming a plurality of contacts in said second dielectric layer.

2. The method according to claim 1, wherein said substrate further comprises a plurality of isolations and a plurality of wells.

3. The method according to claim 1, further comprises forming an additional anti-reflection layer on said polysilicon layer before said first photo-resist is formed.

4. The method according to claim 3, wherein methods for forming said additional anti-reflection layer comprises chemical vapor deposition.

5. The method according to claim 1, wherein said first metal oxide semiconductor material of said spacers of said first metal oxide semiconductor transistors comprises nitride.

6. The method according to claim 1, wherein said second metal oxide semiconductor transistors contain spacers and material of said spacers of said second metal oxide semiconductor transistors comprises oxide.

7. The method according to claim 1, wherein said first metal oxide semiconductor transistors comprise complementary metal oxide semiconductor transistors.

8. The method according to claim 1, wherein structure of each said first metal oxide semiconductor transistor comprises a source, a drain, a gate and a light doped drain.

9. The method according to claim 1, wherein structure of each said first metal oxide semiconductor transistor further comprises a pocket.

10. The method according to claim 1, wherein structure of each said second metal oxide semiconductor transistor comprises a source, a drain and a gate.

11. The method according to claim 1, wherein material of said first dielectric layer comprises ONO composite dielectric tri-layer.

12. The method according to claim 11, wherein said ONO composite dielectric tri-layer is formed by three adjacent dielectric layers, where the middle layer is a SiN layer and each of other layers is an oxide layers.

13. The method according to claim 1, wherein material of said second dielectric layer comprises oxide.

14. The method according to claim 1, wherein material of said anti-reflection layer comprises SiON.

15. The method according to claim 1, wherein material of said anti-reflection layer comprises nitride.

16. The method according to claim 1, wherein material of said silicide comprises $TiSi_2$.

17. The method according to claim 1, wherein material of said silicide comprises $CoSi_2$.

18. The method according to claim 1, wherein the thickness of said tunneling oxide layer is between 80–100 angstroms.

19. The method according to claim 1, wherein a plurality of second thermal oxide layers are formed on sidewalls of said second mental oxide semiconductor transistors and said second thermal oxide layers are implemented by a chemical vapor deposition process.

20. The method according to claim 19, wherein a temperature of said chemical vapor deposition process for forming said second thermal oxide layers is about 780° C. to 800° C.

21. The method according to claim 1, wherein material of a plurality of spacers of said second metal oxide semiconductor transistors can be different from material of a plurality of spacers of said first metal oxide semiconductor transistors.

22. The method according to claim 1, wherein a plurality of second thermal oxide layers are formed on sidewalls of said second metal oxide semiconductor transistors before a plurality of spacers of said second metal oxide semiconductor transistors are formed.

* * * * *